United States Patent
Chen et al.

(10) Patent No.: US 6,503,847 B2
(45) Date of Patent: Jan. 7, 2003

(54) ROOM TEMPERATURE WAFER-TO-WAFER BONDING BY POLYDIMETHYLSILOXANE

(75) Inventors: Yu Chen, Singapore (SG); Quanbo Zou, Singapore (SG); Uppili Sridhar, Singapore (SG); Pang Dow Foo, Singapore (SG)

(73) Assignee: Institute of Microelectronics, Singapore (SG)

( * ) Notice: Subject to any disclaimer, the term of this patent is extended or adjusted under 35 U.S.C. 154(b) by 5 days.

(21) Appl. No.: 09/841,940

(22) Filed: Apr. 26, 2001

(65) Prior Publication Data

US 2002/0160582 A1 Oct. 31, 2002

(51) Int. Cl.[7] .................................................. H01L 21/31
(52) U.S. Cl. ....................... 438/780; 438/106; 438/110; 438/118; 156/109; 156/152; 264/135
(58) Field of Search ................................ 438/106, 107, 438/108, 109, 110, 111, 112, 113, 114, 115, 116, 117, 118, 780; 156/109, 152; 264/135, 236

(56) References Cited

U.S. PATENT DOCUMENTS 3,889,023 A    6/1975  Plueddemann .............. 428/429
4,090,006 A  * 5/1978  Havas et al. ................... 428/81
4,721,994 A  * 1/1988  Mine et al. ..................... 357/70
5,273,205 A   12/1993  Ju et al. ......................... 228/193
5,378,535 A    1/1995  Moncur et al. ............. 428/335
5,389,170 A  * 2/1995  Brady et al. ................. 156/109
5,503,704 A    4/1996  Bower et al. ................ 156/281
5,820,648 A   10/1998  Akaike et al. .................. 65/36
5,863,988 A  * 1/1999  Hashimoto et al. ......... 525/105
5,880,010 A    3/1999  Davidson ..................... 438/455
5,997,786 A  * 12/1999  Arthur et al. ................ 264/135
6,235,363 B1 * 5/2001  Bilodeau ................... 428/40.1
2002/0031863 A1 * 3/2002  Nakata et al. .............. 438/113

* cited by examiner

*Primary Examiner*—Matthew Smith
*Assistant Examiner*—Renzo N. Rocchegiani
(74) *Attorney, Agent, or Firm*—George O. Saile; Stephen B. Ackerman

(57) ABSTRACT

A method of forming bonds between similar and dissimilar material surfaces particularly the surfaces of silicon wafers having various devices disposes thereon, wherein such bonds can be formed at room temperature and do not require the application of high pressures or voltages. The bonding material is polydimethylsiloxane, which is transparent and bio-compatible.

9 Claims, 1 Drawing Sheet

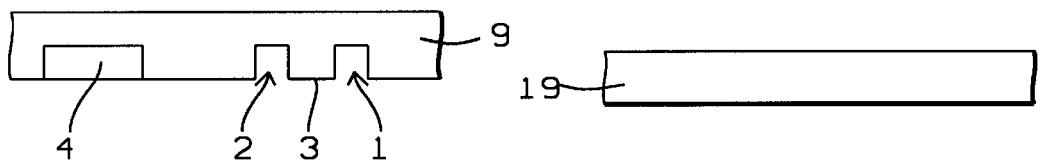
FIG. 1  FIG. 2
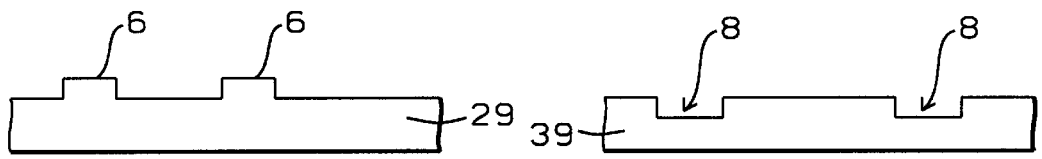
FIG. 3  FIG. 4
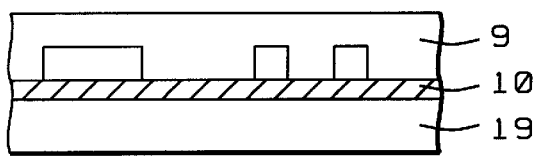 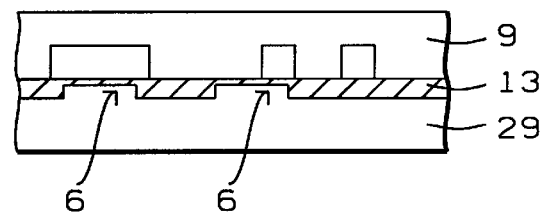
FIG. 5  FIG. 6
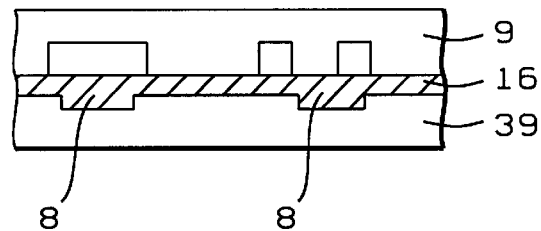
FIG. 7

ROOM TEMPERATURE WAFER-TO-WAFER BONDING BY POLYDIMETHYLSILOXANE

BACKGROUND OF THE INVENTION

1. Field of the Invention

The present invention relates to the field of microelectronic circuitry, more specifically to the use of wafer-to-wafer bonding as a technique for circuit fabrication, encapsulation and packaging.

2. Description of the Related Art

Wafer-to-wafer bonding is an important method for wafer level encapsulation as well as for the coupling of device layers in an integrated circuit. For example, Davidson (U.S. Pat. No. 5,880,010) discloses an integrated circuit comprising a plurality of active layers that are electrically and mechanically coupled by means of a wafer bonding method.

The prior art discloses several methods for achieving wafer-to-wafer bonding, each of which involves the imposition of at least one processing step that subjects the wafers to adverse conditions such as application of a high electrical voltage, application of a high temperature or the use of high contact pressures. High temperatures can cause unwanted variations of wafer doping concentrations, internal stresses due to difference in thermal expansion coefficients between layers, wafer warping, crystal dislocations and various other undesirable effects on certain materials, such as bio-materials, already present in the subject devices. In a similar manner, high contact pressures may damage devices formed in the wafers, as can the use of high voltage differences. For example, Ju et al (U.S. Pat. No. 5,273,205) teaches a method of silicon-to-silicon wafer bonding that requires an 1,100° C. heat treatment for 10 minutes in a wet oxygen gas atmosphere. Akaike et al (U.S. Pat. No. 5,820,648) teach an anodic bonding process in which a silicon substrate and a glass substrate are bonded in a process involving the application of both a potential difference between the substrates simultaneously with light irradiation. Bower et al. (U.S. Pat. No. 5,503,704) teach a method for nitrogen based bonding of similar or dissimilar materials at temperatures below 500° C., but still appreciably above room temperature. In addition the method requires plasma activation and a curing time of approximately 4 days. Davidson, (U.S. Pat. No, 5,880,010), already cited above, teaches a method of forming complex integrated circuits by bonding together a plurality of active layers (ie. layers already provided with circuitry). Two bonding methods are taught, thermosonic bonding and nitride laminating. Both methods require the formation of pads to insure the bonding. The prior art also discloses several methods for bonding silicon elastomers to glass, metal and polymeric materials. Plueddemann (U.S. Pat. No. 3,889,023) teaches a method of bonding a silicone rubber of a general organopolysiloxane composition to a solid substrate. Moncur et al. (U.S. Pat. No. 5,378,535) also teaches a method for bonding silicone elastomers to glass or plastic substrates, wherein an organosilane component is formed on silica-based adhesion promoter.

As already noted above, the methods of the prior art either subject the materials to be bonded to adverse conditions such as high temperature, high contact pressure or high voltage or else they require complex process steps and long curing times. It is the purpose of the present invention to provide a bonding method that avoids these shortcomings of the prior art.

SUMMARY OF THE INVENTION

It is a first object of the present invention to provide a method for wafer-to-wafer bonding that is implemented at room temperature and does not requires the application of electrical potential or high pressures.

It is a second object of the present invention to provide a method for wafer-to-wafer bonding which has a wide application domain in terms of the nature of devices, structures, and materials that may be disposed on said wafers.

It is a third object of the present invention to provide a method for wafer-to-wafer bonding that comprises a simple sequence of process steps.

It is a fourth object of the present invention to provide a method for wafer-to-wafer bonding using materials that are bio-compatible and transparent and which can, thereby, be applied to such uses as the packaging and assembly of bio-MEMS (MicroElectro Mechanical Systems) systems and devices, and other bio-medical devices.

It is a fifth object of the present invention to provide a method for bonding similar or dissimilar materials chosen from, but not limited to, the group consisting of glass, silicon, silicon materials and compounds such as silicon dioxide and silicon nitride, and metals such as Ti, Au, Al and Cr.

The above objects will be realized by the use of polydimethylsiloxane as a bonding agent, which allows the bonding process to be carried out at room temperature (23° C.), in the absence of applied voltages and high pressures and in the following simple sequence of steps: (a) spin coating, (b) alignment and application of light pressure to assure surface-to-surface contact and air bubble removal, (c) curing.

BRIEF DESCRIPTION OF THE DRAWINGS

FIG. 1 is a schematic cross-sectional view of the firs of two wafers to be bonded. This wafer is a wafer of general form, which may have cavities, projections, sensors, devices or moving parts.

FIG. 2 is a schematic cross-sectional view of the second of two wafers, which will be bonded to the wafer of FIG. 1. This figures shows a first type of such a wafer, without cavities, projections, sensors, devices or moving parts.

FIG. 3 is a schematic cross-sectional view of the second of two wafers, which will be bonded to the wafer of FIG. 1. This figure shows a second type of such a wafer, with projections.

FIG. 4 is a schematic cross-sectional view of the second of two wafers, which will be bonded to the wafer of FIG. 1. This figure shows a third type of such a wafer, with cavities.

FIG. 5 shows a schematic cross-sectional view of a bond that would be obtained by bonding the wafer of FIG. 1 with that of FIG. 2.

FIG. 6 shows a schematic cross-sectional view of a bond that would be obtained by bonding the wafer of FIG. 1 with that of FIG. 3.

FIG. 7 shows a schematic cross-sectional view of a bond that would be obtained by bonding the wafer of FIG. 1 with that of FIG. 4.

DESCRIPTION OF THE PREFERRED EMBODIMENT

Referring first to FIG. 1, there is shown a schematic cross-sectional view of a wafer (9), hereinafter referred to as the first wafer, which is to be bonded to a wafer, hereinafter referred to the second wafer, which second wafer, according to the nature of its surface structures, will be depicted in FIGS. 2, 3 and 4. The first wafer quite generally may be provided on its surface to be bonded with cavities (1), sensors (2), devices (3) or moving parts (4), which are indicated here in completely schematic form.

Referring now to FIG. 2, there is shown a schematic cross-sectional view of the second wafer (19), to which the first wafer will be bonded in accord with the process of the present invention. The particular surface configuration of second wafer depicted in this figure is characterized as a wafer without cavities, sensors or moving parts and is denoted, as such, as a type 1 wafer.

Referring now to FIG. 3, there is shown a schematic cross-sectional view of a type 2 second wafer (29), which is a wafer having surface projections (6), which could be devices, sensors, bio-MEMS devices or other surface structures.

Referring next to FIG. 4, there is shown a type 3 second wafer (39), which is a wafer having cavities (8), which could be a result of the presence on said surface of device sensors, bio-MEMS devices or other surface structures. The bonding of the first wafer (FIG. 1) to the type 1 second wafer will be accomplished in accord with the method of the present invention by the sequence of 5 process steps which described below. The bonding of the first wafer to either the type 2 (FIG. 3) or type 3 (FIG. 4) second wafer will also be accomplished according to the present invention by the same 5 steps disclosed above in connection to the bonding of the first wafer to the type 1 second wafer if the depth of said surface cavities and the height of said surface projections are no more than 0.5 $\mu$m relative to the surface of said wafers. The process steps of the present invention, in accord with its preferred embodiment, are as follows:

1. Polydimethylsiloxane Solution Preparation.

One part of room temperature volatile (RIV) elastomeric polydimethylsiloxane conformal coating is mixed with three parts of linear volatile methylsiloxane fluid at room temperature (23° C.) to make a 25% (by weight) concentration of polydimethylsiloxane solution.

2. Polydimethylsiloxane Film Coating Process.

Manually pour 5–10 ml (milliliters) of the 25% polydimethylsiloxane solution on the second wafer and spin said second wafer for approximately 30 sec. at a spin speed of approximately 1700 rpm (revolutions per minute) to form, thereby, a polydimethylsiloxane film of approximately 1.8 $\mu$m (microns) thickness.

3. Pre-Curring.

After the spin coating of step 2 above, the polydimethylsiloxane film so formed must be pre-cured at room temperature (23° C.) for between 5–10 minutes.

4. Algin Bonding

The patterned surface side of the first wafer is placed in contact with the polydimethylsiloxane film formed upon the second wafer and the two said wafers are slightly pressed together with a pressure comparable to hand pressure, so as to ensure full contact between the said surfaces to be bonded and to ensure that most air bubbles are removed.

5. Final Curing

The bonded wafer pair must be finally cured at room temperature (23° C.) for at least 4 hours.

As a result of the sequence of 5 steps provided above, a bond is formed whose strength is 3 MPa (MegaPascals), as determined by a pull test for glass-to-silicon bonding wherein said silicon has 3 $\mu$m silicon dioxide surface coating.

Referring now to FIG. 5, there is shown a schematic cross-sectional view of a bonded wafer pair wherein the bond is formed in accord with the 5 process steps of the present invention set forth above and is between a first wafer (9) and a type 1 second wafer (19). The polydimethylsiloxane film (10) providing said bond is shown conformally adhering to said second wafer.

Referring to FIG. 6, there is shown a similar view of a bonded wafer pair wherein the bond is formed in accord with the 5 process steps above and is between a first wafer (9) and a type 2 second wafer (29). The polydimethylsiloxane film (13) providing said bond is shown conformally adhering to said second wafer and covering projections (6) that do not extend more than 0.5 $\mu$m above the surface of said second wafer.

Finally, referring to FIG. 7 there is shown a similar view of a bonded wafer pair wherein the bond is formed in accord with the 5 process steps above and is between a first wafer (9) and a type 3 second wafer (39). The polydimethylsiloxane film (16) providing said bond is shown conformally adhering to said second wafer and filling cavities (8) that do not descend more than 0.5 $\mu$m below the surface of said second wafer.

As a result of the sequence of 5 steps provided by the present invention, the bond formed and illustrated in FIGS. 5–7 has a strength of 3 MPa (MegaPascals), as determined by a pull test, for glass-to-silicone bonding wherein said silicon has 3 $\mu$m silicon dioxide surface coating.

As a result of the sequences of 5 steps provided above, the bond depicted in FIGS. 5–7 a strength 3 MPa (MegaPascals), as determined by a pull test for glass-to-silicon bonding wherein said silicon has 3 $\mu$m silicon dioxide surface coating.

As is understood by a person skilled in the art, the preferred embodiment of the present invention is illustrative of the present invention rather than limiting of the present invention. Revisions and modifications may be made to methods, materials, structures and dimensions employed in room-temperature wafer-to-wafer bonding by polydimethylsiloxane, while still providing a method for room temperature wafer-to-wafer bonding by polydimethylsiloxane in accord with the spirit and scope of the present invention as defined by the appended claims.

What is claimed is:

1. A method for forming a bond between similar or dissimilar material or material composite substrates at room temperature (23° C.), without the application of electrical potential differences or high pressures to or between said substrates, comprising:

providing a first and second substrate, wherein the surface of each of said substrates may have projections or cavities that vary by no more than 0.5 microns from said surface level;

forming on the surface of said second substrate a layer of polydimethylsiloxane solution;

pre-curing said polydimethylsiloxane solution form on said second substrate surface at room temperature (23° C.) for a time of between approximately 5 and approximately 10 minutes;

bringing the surface of said first material substrate into contact with the said polydimethylsiloxane coated surface of said second material substrate;

exerting sufficient pressure between said two surfaces to assure they are fully in contact and that most air bubbles between said surfaces have been removed;

curing the resulting formation at room temperature (23° C.) for at least 4 hours to create the final bond.

2. The method of claim 1 wherein the first material substrate is chosen from the set of materials or material composites comprising glass, silicon, polysilicon, metal, such as, but not limited to Ti, Au, Al or Cr, on silicon, metal such as, but not limited to Ti, Au, Al or Cr, on glass, metal such as, but not limited to Ti, Au, Al or Cr, on silicon dioxide or silicone dioxide related materials, silicon dioxide or silicon dioxide related materials, metal such as, but not limited to Ti, Au, Al or Cr, on silicon nitride or silicone nitride related materials, silicon nitride or silicon nitride related materials, polymeric materials such as parylene and 1H, 1H, 2H, 2H-perfluorodecyltrichlorosilane films.

3. The method of claim 1 wherein the second material substrate is chosen from the set of materials or material composites comprising glass, silicon, polysilicon, metal such as, but not limited to Ti, Au, Al or Cr, on silicon, metal such as, but not limited to Ti, Au, Al or Cr, on glass, metal such as, but not limited to Ti, Au, Al or Cr, on silicon dioxide or silicon dioxide related materials, silicon dioxide or silicon dioxide related materials, metal such as, but not limited to Ti, Au, Al or Cr, on silicon nitride or silicon nitride related materials, silicon nitride or silicon nitride related materials, polymeric materials such as parylene and 1H, 1H, 2H, 2H-perfluorodecyltrichlorosilane films.

4. The method of claim 1 wherein the polydimethylsiloxane solution is formed by mixing room temperature volatile (RTV) elastomeric polydimethylsiloxane conformal coatings and linear volatile methylsiloxane fluids at room temperature (23° C.) to form a 25% (by weight) polydimethylsiloxane solution.

5. The method of claim 4 wherein the polydimethylsiloxane film is formed to a thickness of approximately 1.8 microns, by a process of spinning between 5 and 10 milliliters of said polydimethylsiloxane solution, manually poured on said second material substrate surface at a spin speed of approximately 1700 rpm.

6. The method of claim 4 wherein the polydimethylsiloxane film is formed to a thickness of between 0.8 microns and 15 microns, by a process of spinning between 5 and 10 milliliters of said polydimethylsiloxane solution, manually poured on said second material substrate surface, at a spin speed of approximately 1700 rpm.

7. A method for forming a bond between a first and second silicon substrate, at room temperature (23° C.), without the application of electrical potential differences or high pressures to or between said substrates, wherein there is formed on the said silicon substrates microelectronic devices, microsensors, MEMS devices and biomedical devices, either singly or in combination, comprising:

providing a first and second silicon substrate, wherein the said microelectronics devices, microsensors, MEMS devices and biomedical devices, formed either singly or in combination on said substrates, produce projections or cavities that vary by no more than 0.5 microns from said surface level, forming on the surface of said second silicon substrate a layer of polydimethylsiloxane solution;

pre-curing said polydimethylsiloxane solution formed on said second substrate surface at room temperature (23° C.) for a time of between approximately 5 and approximately 10 minutes;

brining the surface of said first silicon substrate into contact with the said polydimethylsiloxane coated surface of said second silicon substrate, exerting sufficient pressure between said two silicon substrate surfaces to ensure they are fully in contact and that most air bubbles between said surfaces have been removed;

curing the resulting formation at room temperature (23° C.) for at least 4 hours to create the final bond.

8. The method of claim 7 wherein the polydimethylsiloxane solution is formed by mixing RTV elastomeric polydimethylsiloxane conformal coatings and linear volatile methylsiloxane fluids at room temperature (23° C.) to form a 25% (by weight) polydimethylsiloxane solution.

9. The method of claim 8 wherein the polydimethylsiloxane film is formed to a thickness of approximately 1.8 microns, but which may be between 0.8 microns and 15 microns, by a process of spinning between 5 and 10 milliliters of said polydimethylsiloxane solution, manually poured on said second material substrate surface at a spin speed of approximately 1700 rpm.

* * * * *